(12) United States Patent
Davidovici

(10) Patent No.: US 7,532,145 B2
(45) Date of Patent: *May 12, 2009

(54) HIGH RESOLUTION AND WIDE DYNAMIC RANGE INTEGRATOR

(75) Inventor: Sorin Davidovici, Oceanport, NJ (US)

(73) Assignee: RJS Technologies Inc., Hollis, NH (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/533,859

(22) Filed: Sep. 21, 2006

(65) Prior Publication Data

US 2007/0075881 A1  Apr. 5, 2007

Related U.S. Application Data

(60) Provisional application No. 60/727,897, filed on Oct. 18, 2005, provisional application No. 60/719,305, filed on Sep. 21, 2005, provisional application No. 60/719,304, filed on Sep. 21, 2005, provisional application No. 60/719,306, filed on Sep. 21, 2005.

(51) Int. Cl.
*H03M 1/60* (2006.01)

(52) U.S. Cl. .................. 341/157; 327/175; 323/272; 455/317; 345/213

(58) Field of Classification Search ......... 341/120–170; 345/213
See application file for complete search history.

(56) References Cited

U.S. PATENT DOCUMENTS

| 4,352,210 | A | * | 9/1982 | Puckette | ............... 455/317 |
| 4,419,692 | A | | 12/1983 | Modisette | |
| 4,629,879 | A | | 12/1986 | Baldwin | |
| 4,825,144 | A | * | 4/1989 | Alberkrack et al. | ......... 323/272 |
| 5,416,616 | A | | 5/1995 | Jenkins et al. | |
| 5,461,426 | A | | 10/1995 | Limberg | |
| 5,703,641 | A | | 12/1997 | Watanabe | |

(Continued)

FOREIGN PATENT DOCUMENTS

EP    1484740 A2    12/2004

OTHER PUBLICATIONS

International Search Report PCT/US06/36793, Apr. 2, 2007, Davidovici.

(Continued)

*Primary Examiner*—Lam T Mai
(74) *Attorney, Agent, or Firm*—Anderson Gorecki & Manaras LLP

(57) ABSTRACT

Integrators are electronic components used to condition received analog signals, for example prior to Analog to Digital Conversion. Wide dynamic range, high gain and fine resolution are required of integrators and Analog to Digital Converters in order to limit the effects of noise, including quantization noise. Conventional integrators preceding Analog to Digital Converters are not capable of effectively meeting these requirements. A novel phase domain integrator that can meet effectively these requirements and is superior to conventional integrators for a wide range of applications is disclosed.

13 Claims, 10 Drawing Sheets

U.S. PATENT DOCUMENTS

| | | |
|---|---|---|
| 6,188,056 B1 | 2/2001 | Kalnitsky |
| 6,320,574 B1 * | 11/2001 | Eglit .......................... 345/213 |
| 6,380,778 B2 * | 4/2002 | Uehara et al. ............... 327/175 |
| 6,437,850 B2 | 8/2002 | Vernackt |
| 6,794,922 B2 | 9/2004 | Mashimo |
| 6,809,358 B2 | 10/2004 | Hsich et al. |
| 6,821,245 B2 | 11/2004 | Cline |
| 6,849,841 B2 | 2/2005 | Byren |
| 6,867,693 B1 | 3/2005 | Radin |
| 2002/0033714 A1 | 3/2002 | Perrott |

OTHER PUBLICATIONS

International Search Report PCT/US06/36785, May 11, 2007, Davidovici.

International Search Report PCT/US06/36794, May 22, 2007, Davidovici.

International Search Report PCT/US06/40640, Aug. 28, 2007, Davidovici.

* cited by examiner

HIGH RESOLUTION AND WIDE DYNAMIC RANGE INTEGRATOR

CROSS REFERENCE TO RELATED APPLICATIONS

This application claims priority under 35 U.S.C. §1.119(e) to provisional patent application Nos. 60/719,306, 60/719,304 and 60/719,305, filed on Sep. 21, 2005 by Davidovici et al, and to provisional patent application Ser. No. 60/727,897 filed Oct. 18, 2005 by Davidovici et al. All of the above identified priority applications are incorporated herein by reference.

FIELD OF THE INVENTION

This invention relates generally to the field of sensor devices and more particularly to an integration method and apparatus.

BACKGROUND OF THE INVENTION

The integration function, or integral, is a mathematical function that is well known in the art. Briefly, an integral is a mathematical object that can be interpreted as an area or a generalization of area. If a signal is plotted as a curve, the integral of the signal is the area under the curve. An integrator is a device that integrates a signal present at its input and produces an integrated version of the input signal at its output.

Integrators are often used to improve the quality of electronic signals prior to further processing steps. By way of example FIG. 1 illustrates a signal source 100 and a signal processing chain that consists of integrator 110, analog to digital converter (ADC) 120 and DSP 130. In FIG. 1 analog to digital conversion implemented by ADC 120 and digital signal processing steps using DSP 130 are further processing steps that rely on high quality integrator output.

Signal source 100 generates a signal. By way of example, signal source 100 could be a sensor such as a strain gage, a fuel flow sensor, a light intensity sensor or any other type of device that generates a signal in response to external stimuli. Signal source 100 is often, but not always, physically removed from the circuit assembly containing integrator 110, analog to digital converter (ADC) 120 and DSP 130.

The quality of the signal is improved by integrator 110 which integrates the signal $V_{IN}$. FIG. 2 illustrates the nature of the signal improvement. Waveform 200 is the combination of a constant value signal generated by signal source 100 and additive noise that corrupts the constant value signal. Waveform 210 is the integrator output generated in response to input signal waveform 200. It is readily observed that signal fluctuations caused by the additive noise are decreased by operation of the integrator, as illustrated by waveform 210.

The output of integrator 110, $V_{OUT}$, is input to ADC 120. ADC 120 performs the analog to digital conversion function. The analog to digital conversion function is well known in the art. The analog signal $V_{OUT}$ present at ADC 120 input is converted into signal $V_D$ that can take one of a set of discrete levels.

FIG. 3 illustrates two ADC 120 input signals, 300 and 310, and corresponding ADC 320 output levels. Signals 300 and 310 are integrator 110 outputs in response to input signals of unequal power. Signal 300 is an integrator 110 output in response to a higher power input signal. Signal 310 is an integrator 110 output in response to a low power input signal.

Vertical bar 320 represents the ADC conversion characteristic. An analog ADC 120 input signal value will be mapped into one of a finite set of discrete signal output values. The horizontal tic marks on bar 320 illustrate the set of discrete ADC 120 output values. ADC 120 is a five-bit device as illustrated here and it converts input signals into one of 32 discrete values. The discrete values span the range of 0 to 31 or 00000 to 11111 in binary representation. There are 32 corresponding tic marks on bar 320, each one corresponding to a specific analog voltage value.

In FIG. 3 ADC 120 samples and converts the signal present at its input at time T=100. Signal 300 reaches a value of five volts at time T=100 and it is converted to digital value 31 which is the highest possible output code of ADC 120. Signal 310 reaches a value of approximately 0.5 volts and it is converted to digital value three which is a relatively low output code of ADC 120. An ADC input signal value that does not correspond exactly to one of the tick marks on bar 320 will be rounded-off to the value of the nearest tick-mark.

The conversion error introduced by the rounding-off process is represented as quantization noise. The quantization error and associated quantization noise introduced by ADC is well known to one versed in the art. The round-off errors are proportionally more significant for lower value signals and less significant for higher value signals. Signal 300 will be affected less by quantization noise than signal 310. In other words the signal to quantization noise ratio of signal 300 will be higher than the signal to quantization noise ration of signal 310.

Signal to quantization noise ratio is a measure of signal degradation that negatively affects system performance. The minimum acceptable signal to quantization noise ratio is a design parameter and for that reason the minimum number of levels or equivalently the minimum number of bits of ADC 120 is a system design requirement.

Another kind of noise that degrades signal quality is additive thermal noise. For a given power of the thermal noise that corrupts ADC 120 input signals, differences in input signal levels smaller than some value cannot be reliable resolved. FIG. 4 illustrates this limitation. FIG. 4 shows the output of integrator 110 due to two different signals. The signals are corrupted by additive thermal noise. The signals have a constant value for the duration of the integration process and the integrator inputs consist of the constant signal values and additive thermal noise. In both cases the output value of interest of integrator 110 occur at time T=100 when the integration process ends.

In FIG. 4A signal 520 is the input to the integrator due to signal #1 which has a constant value of 1.5 volts and signal 530 is the input to the integrator due to signal #2 which has a constant value of 1 volt. Signal 500 is the integrator output due to input signal 520 and signal 510 is the integrator output due to input signal 530. Integrator output signals 500 and 510 cannot be reliably distinguished from one another at time T=100 due to excessive amounts of residual additive noise. This exemplifies that under these noise conditions the minimum required difference in signal levels at the output of integrator 110 should be in excess of the difference between signal #1 and signal #2 which is 0.5 volts. Smaller signal level differences cannot reliable resolved using integrator 110.

In FIG. 4B signal 560 is the input to integrator 110 due to signal #3 which has a constant value of 2.5 volts. Signal 570 is the input to integrator 110 due to signal #4 which has a constant value of 1 volt. Signal 540 is the integrator 110 output due to input signal 560. Signal 550 is the integrator 110 output due to input signal 570. Integrator output signals 540 and 550 can be reliably distinguished from one another at time T=100. This indicates that two signal levels can be reliably resolved if the difference in signal levels at the output of integrator 110 equals the difference between signal #3 and signal #4 which is 1.5 volts.

Signal source 100 will generate a signal of sufficient maximum amplitude to insure that thermal noise effects are limited and do not significantly degrade system performance. This implies that at times the output of integrator 110 might be required to have a value larger than the available power supply voltage.

FIG. 5 illustrates a simple integrator circuit. The integrator input signal is generated by signal source 1000 and corrupted by noise source 1010. The signal and noise are added by adder 1020. This is a diagrammatic representation of signal and additive noise. In real electronic circuits the electronic components intrinsically generate noise and the addition of noise to the signal occurs through inductive and other effects intrinsic to the physical component and system design and layout.

Capacitor 1040 is a simple integrator. The input to the integrator is the output of adder 1020. Capacitor 1040 is reset by switch 1050 which is in the closed position prior to starting the integration process and resets the integrator. At the start of the integration process switch 1050 opens and the voltage across capacitor 1040 begins to change in response to the input signal originating from the output of adder 1020. At the end of the integration process switch 1030 closes and integrator output 1060, $V_{OUT}$, is sampled. FIG. 4 is an illustrative diagram. The implementation of other similar integrators with identical functionality is well known and obvious to one skilled in the art.

Integrator output 1060, $V_{OUT}$, cannot in general exceed the upper limit imposed by the available power supply voltage. Power supply voltages are decreasing in state-of-the-art equipment due to stringent power consumption requirements.

The required output voltage range of integrator 110 and input voltage range of ADC 120 can be in excess of the available system power supply voltage. By way of example this can occur when the output range of signal generator 100 is close to or larger than the available system power supply voltage. When the required output voltage range of integrator 110 is in excess of the available system power supply voltage the integrator output enters into saturation.

Integrator output saturation occurs when the output voltage reaches its maximum value, here the available power supply voltage, and is unable to further increase its value in response to the input signal stimulus. Signal saturation causes system performance degradation. This condition will cause saturation when using conventional integrators, a simplified version of which is illustrated in FIG. 4. Solutions to this problem have been published. The feature the published solutions have in common is the monitoring of the integrator output to detect the onset of saturation condition at which time the integrator is discharged and the event is recorded. By way of example of such solutions Mazzucco discloses in U.S. Pat. No. 6,407,610 methods to prevent saturation of the integrator output. The prevention methods consist of sensing the onset of saturation and resetting (discharging) the integrator or changing the direction of integration when the onset of saturation is sensed. An external circuit records all such events. At the end of the integration period the effective full range of the integration is reconstructed from the number of recorded reset events and from the final integrator output voltage.

This class of solutions is difficult to implement efficiently in integrated circuits (ICs) due to accuracy requirements of analog components and non-standard analog implementations. The implementation of accurate comparators that operate in a noisy environment near the power supply voltage, where integrator outputs begin to saturate, is a difficult undertaking that consumes excessive power, an undesirable operational feature. Analog IC designs are difficult and time consuming to implement. It is advantageous to use standard building blocks that have been fully debugged and optimized for size, power consumption and performance. The class of published solutions does not meet this requirement.

SUMMARY OF THE INVENTION

According to one aspect of the invention, an integration method includes the step of generating an integrated value of an input signal using a response provided by an oscillator coupled to the input signal. Because the integrated signal is generated using the oscillator's response, rather than the signal itself, a wider dynamic range of input voltages may be supported by the integrator; an integrator of the present invention can represent output values which are greater than the power supply of the sensor, because the saturation of the oscillator output cannot occur. In addition, an integrator of the present invention can represent voltages at all ranges with increased resolution; as a result quantization errors are reduced and intensity levels of the signals may be more tightly compressed.

According to another aspect of the invention an integrator includes an input for receiving a signal, an oscillator coupled to the input and operable to provide a response in accordance with a value of the signal, and a mechanism for translating the response provided by the oscillator into an integrator result.

The approach disclosed herein uses a novel approach to integrator implementation that is based on frequency oscillator circuits. Frequency oscillator circuits are standard IC component blocks and do not suffer the disadvantages disclosed herein.

Also, the novel approach disclosed herein implements accurate integrators that can accommodate output signal values far in excess of available power supply voltages and with very high accuracy and dynamic range.

BRIEF DESCRIPTION OF THE FIGURES

FIG. 4A illustrates how the effects of thermal noise may cause confusion for signal intensity spacing of small amounts, while FIG. 4B illustrates that a larger intensity of signal spacing reduces the chances of integrator output value confusion;

Figure 10:
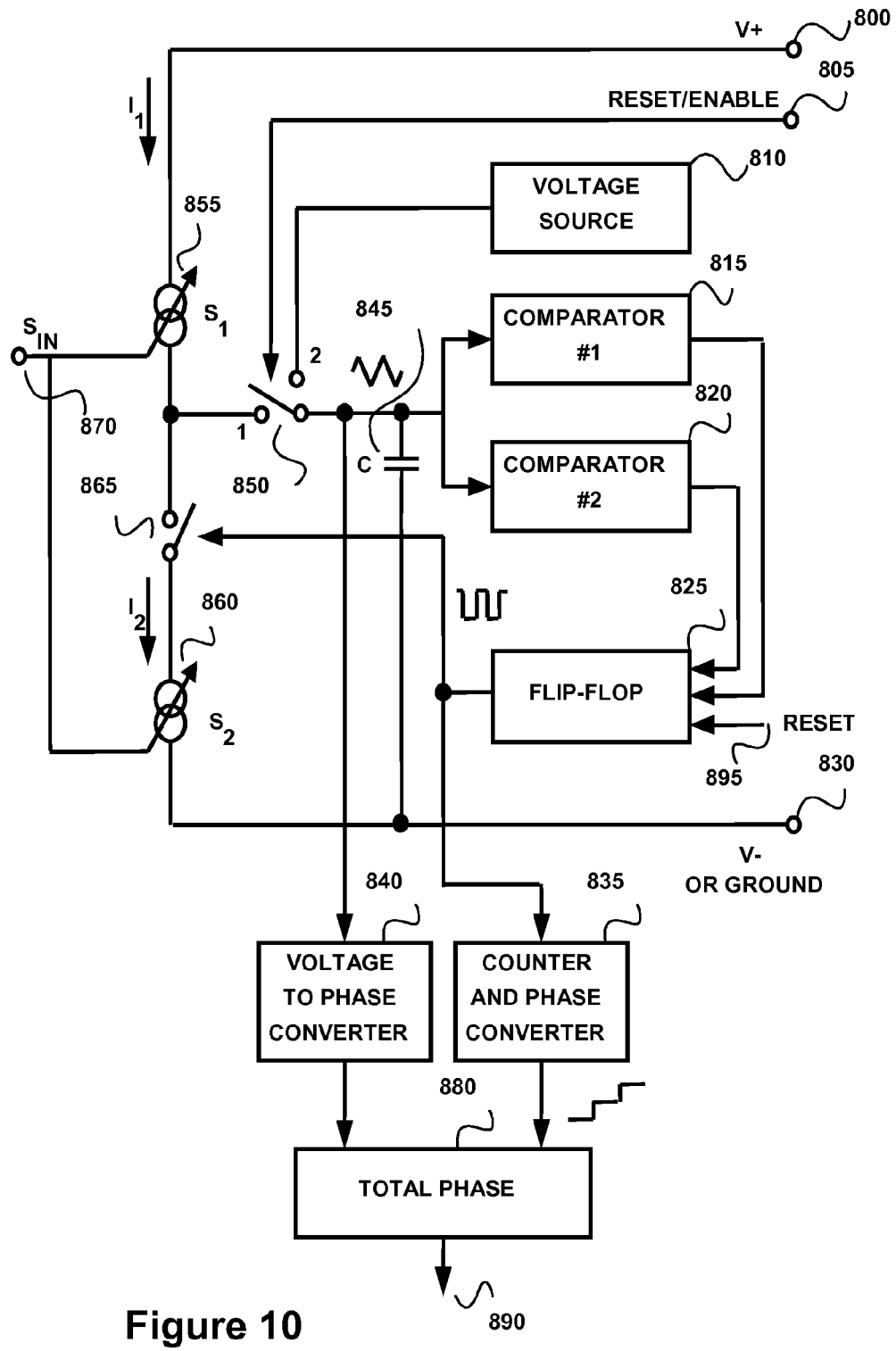

8A-8B, and a integrator output signal (9B), and is used to describe the signal integration capabilities of the present invention;

FIG. 10 is a circuit diagram illustrating representative components that may be included in an integrator operating according to the principles of the present invention.

DETAILED DESCRIPTION

The present invention provides an integration method and integrator which uses a frequency response of an oscillator to integrate an input signal. The present invention recognizes that a relationship exists between the voltage of the signal and the frequency of the oscillator output, and that the phases of the oscillator output can be correlated to the integrated signal value. The correlation allows for integrated output values to be provided with a high degree of resolution, thereby overcoming the problems associated with quantization error. In addition, because the integrator output value is based on oscillator phases, rather than on a simple voltage accuracy of the result is improved because saturation will not occur.

The present invention will now be described with regards to FIGS. 6-10. Oscillators are a class of circuits well known in the art. The output of oscillator circuits can have a variety of shapes but they are all periodic, meaning that the output waveform is repetitive. One repetition of the output waveform comprises one oscillation cycle and the duration of a cycle is defined as its period of oscillation. The frequency of oscillation, $f_{osc}$, is defined as the number of periods of oscillation per unit time and it is usually measured in Hertz (periods of oscillation per second). By convention the angular frequency of an oscillator is defined as $\omega = 2\pi f_{osc}$ and one complete cycle of oscillation traverses a phase angle $\theta$ of $2\pi$ radians.

Associated with an oscillator are initial conditions, that is the state of the system at some arbitrary time, t=0. An example of an initial condition might be the initial phase of the oscillator at t=0 measured in radians. FIGS. 6A-D illustrates common output waveforms of oscillator circuits. As well known in the art FIGS. 6A-D illustrate the respective output waveform of sinusoidal, triangular, saw-tooth and square wave oscillators. In all cases the peak voltage range shown is one volt.

The frequency of oscillation of electronic oscillator circuits can be fixed or variable. A common oscillator with variable frequency of oscillation is the voltage-controlled oscillator (VCO). At a minimum a VCO has a voltage input at which a signal voltage $S_{in}$ controls the frequency of oscillation. Voltage relates to current through Ohm's law and a signal $S_{in}$ can also be said to control the frequency of oscillation through its current rather than voltage characteristic.

A VCO may also have a nominal frequency of oscillation $f_{nom}$. The VCO oscillates at $f_{nom}$ when the frequency control input $S_{in}$ level is not present or of a value that does not modify the nominal frequency of oscillation, such as for example zero volts. The nominal frequency of oscillation can have any specified value including zero Hertz.

The output frequency of the VCO changes in response to amplitude variations of the input signal. Thus the instantaneous frequency of oscillation of the VCO will differ from the nominal frequency of oscillation of the VCO by some value $f_{delta}$ and will be given by $$f_{inst} = f_{nom} + f_{delta}$$

where $$f_{delta} = f_{gain} \cdot S_{in}.$$

In this example the term $f_{delta}$ is measured in radians per second, $f_{gain}$ is measured in radians per second per volt and $S_{in}$ is measured in volts.

Figure 7A:
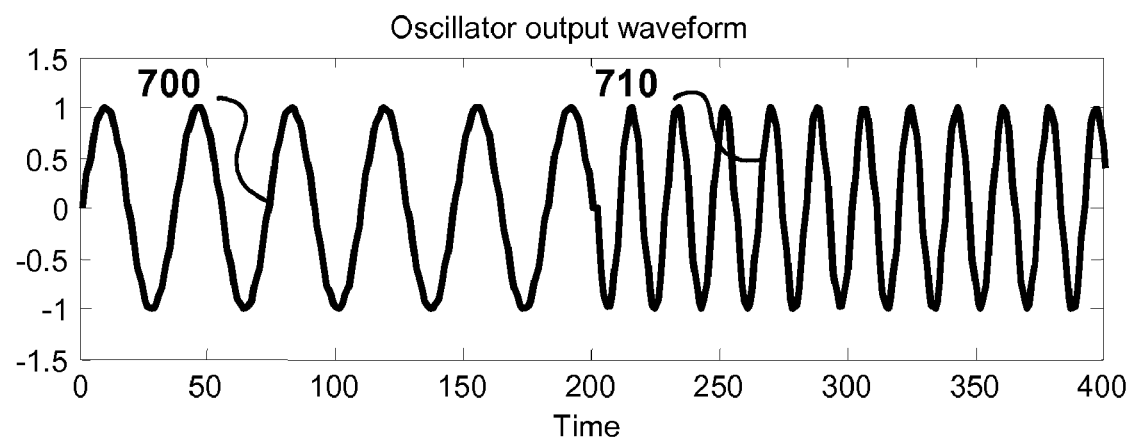
FIG. 7A is a graph which illustrates an oscillator waveform that varies in frequency in response to an oscillator input illustrated in FIG. 7B.
Figure 7B:
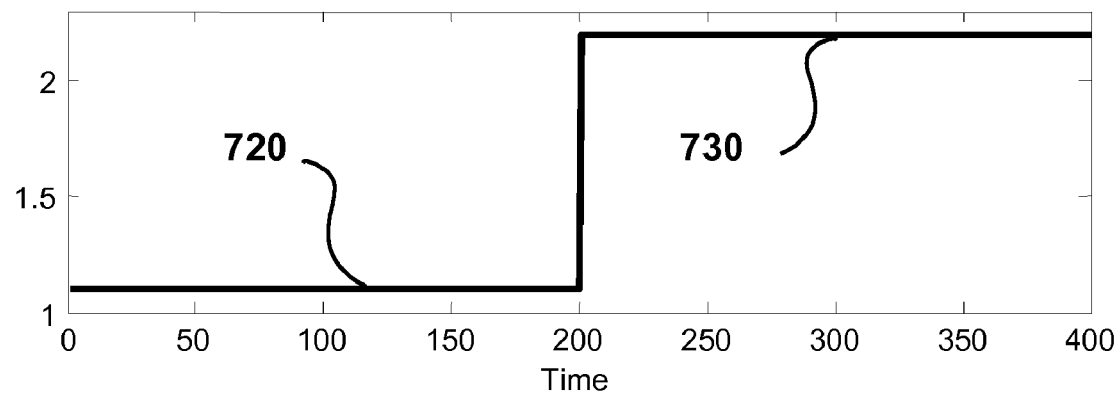

FIG. 7A illustrates the input and output signals of a VCO. The frequency of oscillation of the VCO output changes in response to variations in the input signal amplitude, as illustrated in FIG. 7B. The VCO output segment 700 corresponds to input signal segment 720. The VCO output segment 710 corresponds to input signal segment 730. The frequency of oscillation of VCO output segment 700 is lower than the frequency of oscillation of VCO output segment 710. The amplitude of input signal segment 720 is lower than the amplitude of input signal segment 730. Therefore $f_{gain}$ has a positive value and the VCO frequency of oscillation is directly proportional to the input control signal amplitude.

A VCO may also have additional inputs, such as RESET/ENABLE. The function of RESET/ENABLE when in the RESET state is to reset the VCO output waveform to a predetermined voltage that can be any value within the peak-to-peak voltage range. The function of RESET/ENABLE when in the ENABLE state is to enable the VCO output to oscillate.

A VCO has an output $V_{out}$. During each period of oscillation $V_{out}$ traverses an angular phase of $2\pi$ radians. This implies that the output phase is measurable modulo $2\pi$ and oscillator output values at phases that are separated by exactly $2\pi$ are identical. FIG. 6 illustrates several common VCO output waveforms. During a complete period each waveform in FIG. 6 traverses exactly $2\pi$ radians and waveforms values at phases that are separated by exactly $2\pi$ are identical for all waveforms.

The phase traversed by the oscillator output during a subset of one period is determined by sampling the oscillator output at the two instances of time marking the beginning and end of the subset of one period, identifying the phase associated with each sample and subtracting the two phases.

The phase traversed by the oscillator output during a duration of time that spans more than one period of oscillation can only be determined modulo $2\pi$ radians when using a method based on direct observation of the VCO output at two time instances. In the present invention, the integration may take place over a period of time, herein referred to as the integration period, and according to one aspect of the invention, the number of phases that the oscillator signal traverses over the integration period is accumulated. The present invention includes an additional function that counts the number of periods or significant fractions of a period traversed by the VCO output in order to resolve the ambiguity and provide a high resolution and dynamic range output signal.

Figure 8A:
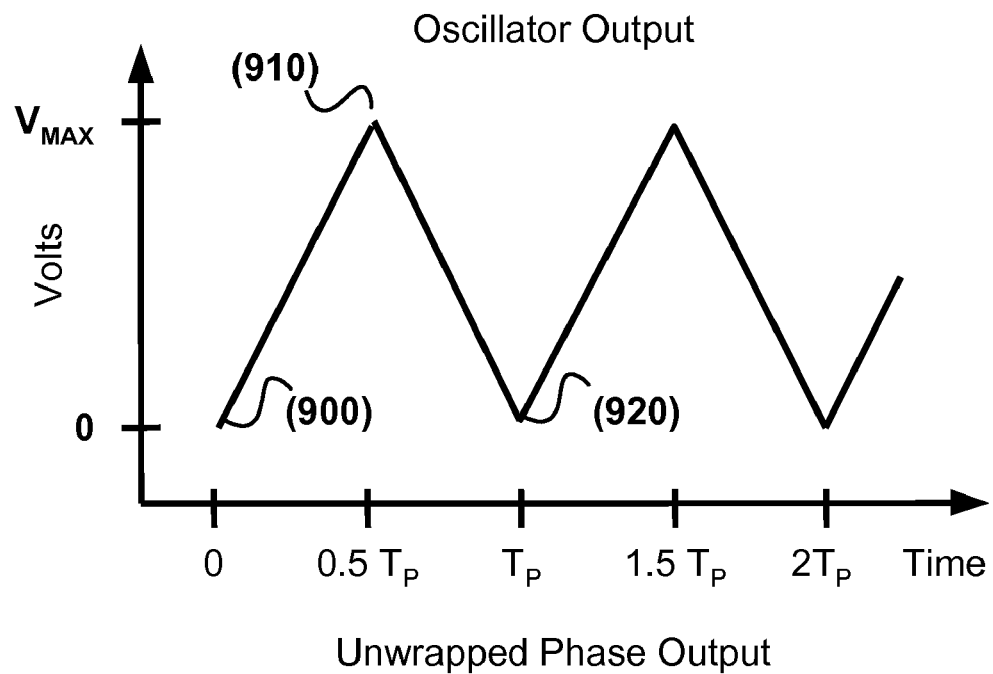
FIGS. 8A and 8B are respective graphs which are used to describe a phase unwrapping technique of the present invention.
Figure 8B:
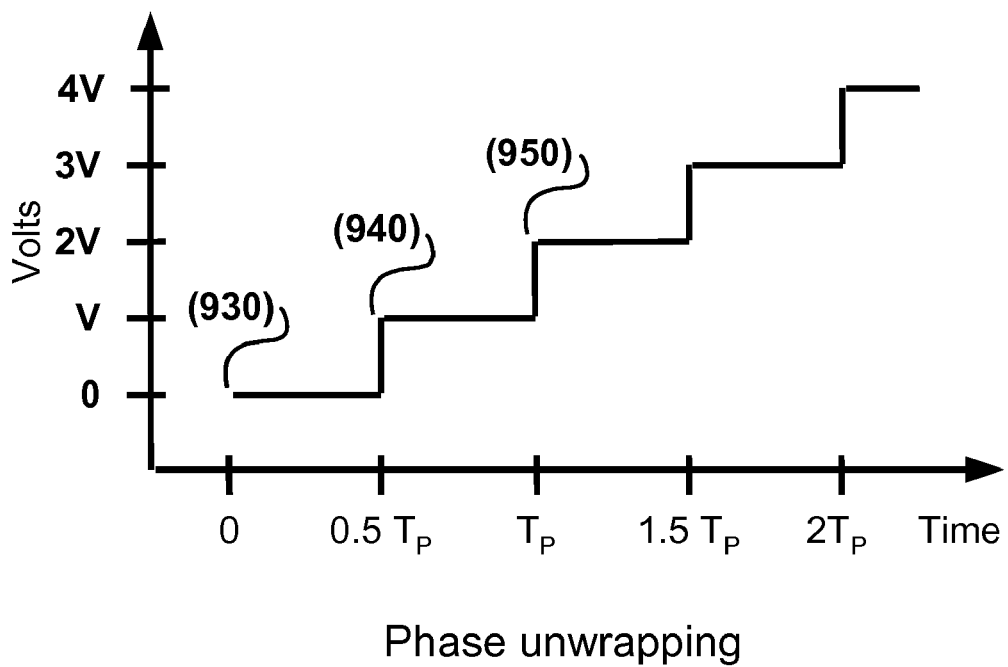

A circuit that counts the number of periods or significant fractions of a period traversed by the VCO output in a time interval, or 'unwraps' the phase, can be readily implemented in many forms. Waveforms associated with such a circuit are illustrated in FIGS. 8A and 8B. The VCO output in FIG. 8A is the triangular waveform. At times t=0, 0.5 $T_p$ and $T_p$ the VCO output waveform reaches states labeled 900, 910 and 920 corresponding to a travel of 0, $\pi$ and $2\pi$ radians.

The output of the phase unwrapping circuit changes states at times t=0, 0.5 $T_p$ and $T_p$ to levels of 0, V and 2V amplitude. The transition times are labeled 930, 940 and 950 and they correspond to the VCO output states labeled 900, 910 and 920, respectively. Thus, the phase unwrapping circuit correlates the respective number of periods of an oscillator output signal to an integrated output voltage.

The relationship between the VCO output and the output of the phase unwrapping circuit illustrated over one period of the VCO output can be extended over any number of VCO output periods with the output of the phase unwrapping circuit increasing in value by a predetermined amount each time the VCO output goes through its 0 and π (modulo 2π) phase values. It is obvious to one skilled in the art that there are alternative ways to implement the phase unwrapping function and mark the value of the unwrapped phase traversed by the VCO output, and the present invention is not limited by or to the particular method disclosed herein.

The total phase traversed by the VCO output is given by the summation of two terms. The first term is the total unwrapped phase recorded by the phase unwrapping circuit. The second term is the total phase traversed by the VCO output since the last update of the phase unwrapping circuit output. This quantity can be unambiguously obtained by direct measurement of the VCO output.

FIG. 10 incorporates a simplified block diagram of the VCO subset of ICL8038 a commercially available IC provided by Intersil™ Corporation of Palm Bay, Fla. 32905. Additional phase unwrapping logic 835, total phase traversed logic 840 and VCO RESET/ENABLE functions 805 of the present invention are added.

Current sources 860 and 855 charge and discharge, respectively, capacitor 845 to generate an oscillating output. The charging and discharging of capacitor 845 is determined by switch 865 which is controlled by flip-flop 825 and which connects current source 860 or 855 to capacitor 845.

Flip-flop 825 changes states when triggered by comparators 815 and 820. Comparator 815 is triggered when capacitor 845 reaches a predetermined high voltage. Comparator 820 is triggered when capacitor 845 reaches a predetermined low voltage. Thus the comparators control the shape and voltage of the oscillating output.

When comparator 815 is triggered, flip-flop 825 changes state such as to cause switch 865 to close. Current I2 of current source 860 causes capacitor 845 to discharge thus causing the voltage across capacitor 845 to decrease. The decrease of the voltage across capacitor 845 immediately causes comparator 815 to change state.

When the voltage across capacitor 845 decreases to a sufficiently low value comparator 820 is triggered. When comparator 820 is triggered flip-flop 825 changes state such as to cause switch 865 to open. Current $I_1$ of current source 855 causes capacitor 845 to charge thus causing the voltage across capacitor 845 to increase. The increase of the voltage across capacitor 845 immediately causes comparator 820 to change state.

When the voltage across capacitor 845 increases to a sufficiently high value comparator 815 is again triggered causing flip-flop 825 to change state and capacitor 845 charge/discharge cycle to repeat.

The relationship between the charge held by capacitor 845 and the voltage across capacitor 845 is Q=C·V where C is the capacitance of capacitor 845 measured in Farads, Q is the charge held by capacitor 845 measured in Coulombs and V is the voltage across capacitor 845 measured in Volts.

The change in charge held by capacitor 845 due to a constant current I that flows for an interval of time ΔT is given by ΔQ=I·ΔT where ΔQ is the change in charge held by capacitor 845 in Coulombs, I is the value of the current in Amperes and ΔT is the interval of time of current flow in seconds. A constant current causes a linear change in the charge held by capacitor 845 as a function of time. The linear change in the charge held by capacitor 845 as a function of time causes a linear change in voltage across capacitor 845 as a function of time.

Figure 6A:
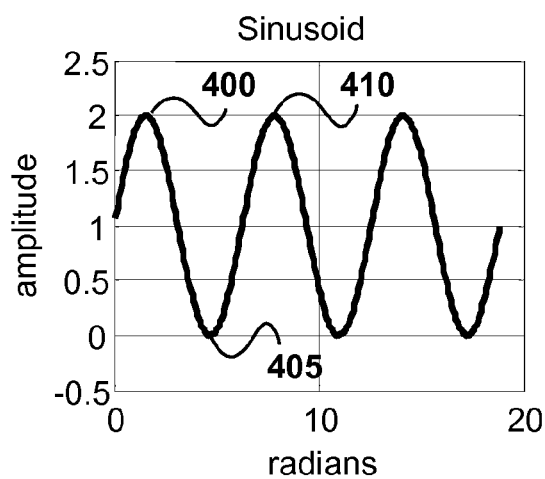
FIGS. 6A-6D are graphs, each of which illustrate outputs of different types of oscillators.
Figure 6B:
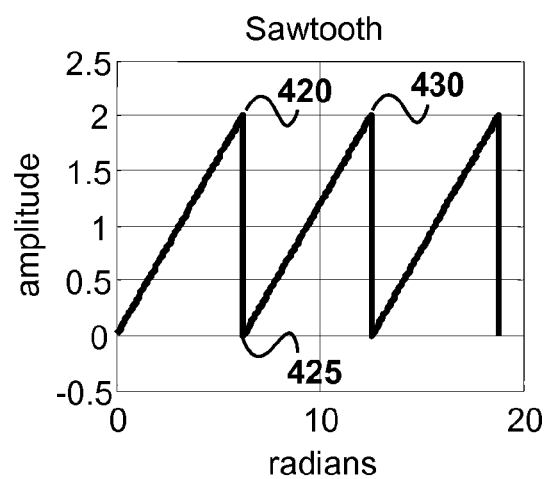
Figure 6D:
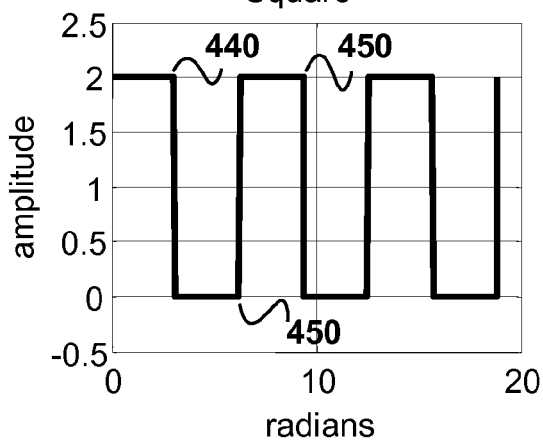
Figure 6C:
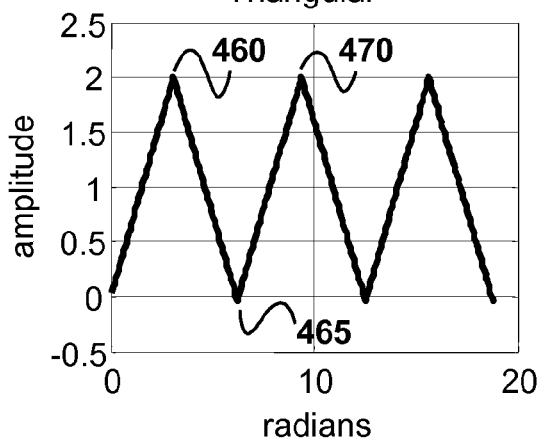

The constant value of currents $I_1$ and $I_2$ generated by current sources 855 and 866 cause the voltage across capacitor 845 to increase and decrease linearly generating a triangular waveform. If the net effects of currents $I_1$ and $I_2$ are equal the rising and falling segments of the triangular voltage waveform across capacitor 845 are symmetric as illustrated in FIG. 6c. If the net effects of currents $I_1$ and $I_2$ are not equal the rising and falling segments of the triangular voltage waveform across capacitor 845 are asymmetric. In the limit as the net effects of current $I_1$ becomes much less than the net effects of current $I_2$ the triangular voltage waveform across capacitor 845 tends to the sawtooth waveform illustrated in FIG. 6b.

The time required to charge and discharge capacitor 845 is determined by the magnitude of currents $I_1$ and $I_2$ generated by current sources 860 and 855. The sum of the times required to charge and discharge capacitor 845 to voltage levels that trigger comparators 815 and 820 determine the period of oscillation of the VCO. Therefore the magnitudes of currents $I_1$ and $I_2$ determine the period and frequency of oscillation of the VCO.

The control signal applied at input 870 controls current sources 860 and 855 and therefore controls the VCO frequency of oscillation. Although not shown a simple voltage or current splitter known as well to one versed in the art can be added between the control signal applied at 870 and current sources 860 and 855 to adjust the waveform symmetry.

Reversal of the voltage across capacitor 845 is controlled by the state of flip-flop 825. Counter 835 is triggered and modifies its output state correspondingly each time flip-flop 825 changes state. The change in counter 835 output state can be a modified voltage level as shown in FIG. 8B. Other voltage level modification schemes can be used as long as separate states are resolvable. Counter 835 output can also be of a digital format consisting of a digital word containing B bits. In such case a change in its output state can be a binary number where different states differ in one or more bits.

The output state of counter 835 changes each time flip-flop 825 changes states and therefore counts how many times the VCO output reached its minimum and maximum values. If the output state of counter 835 is an even number the output of the VCO traversed an integer multiple of 2π radians. The number of 2π radians traversed by the VCO output is then given by dividing the output count of counter 835 by two.

If the output state of counter 835 is an odd number the number of 2π radians traversed by the output of the VCO has an integer and a fractional part. The integer part of the number of 2π radians traversed by the output of the VCO is given by dividing by two a number obtained by subtracting one from the output state of counter 835. The fractional part of the number of 2π radians traversed by the output of the VCO depends on the degree of asymmetry between the rising and falling segments of the waveform and can be readily obtained by one skilled in the art. By way of example if the rising segment of the waveform takes twice as long as the falling segment of the waveform than then it requires ⅔ of a period of oscillation to complete.

The voltage across capacitor 845 is proportional to the phase traversed by the VCO output following the last change in state of flip-flop 825. It can be readily obtained by one skilled in the art if a) the trigger voltages of comparators 815 and 820 (i.e., the maximum and minimum voltages of the VCO output) and b) the asymmetry between the rising and falling segments of the VCO output waveform are known. By way of example consider that if a) the VCO output voltage is halfway between the minimum and maximum value on the rising segment of the waveform and b) the rising segment of the waveform takes twice as long as the falling segment of the waveform then the waveform measurement is at ⅓ of a period of oscillation.

The total phase traversed by the output of the VCO is obtained by summing the phase traversed by the VCO output as recorded by the voltage to phase converter 840 and by counter and phase converter 835. This function is performed by summer 880 and made available at output 890.

Switch 850 resets capacitor 845 and therefore the VCO oscillator output to an initial voltage output by voltage source 810. Flip-flop 825 is reset by signal 895. The initial voltage of voltage source 810 together with the reset state of flip-flop 825 and the degree of asymmetry between the rising and falling segments of the VCO output waveform are sufficient to determine the initial phase of the VCO output waveform. This derivation is well known to one versed in the art.

As well known in the art and described in the ICL8038 application notes literature sinusoidal, square and sawtooth waveforms are derived by additional internal circuits using the basic triangular waveform discussed herein. Therefore the items addressed herein apply equally to other VCO output waveform shapes.

Phase and frequency have a differential relationship. The total phase traversed by an oscillator output $V_{out}$ during a duration of time $\Delta T$ is mathematically given by $$\Delta\theta = \int f_{inst} dt = \int (f_{nom} + f_{gain} \cdot S_{in}) dt$$

where the integral limits are over the time duration $\Delta T$.

Separating the integral terms $$\Delta\theta = \int (f_{nom} + f_{gain} \cdot S_{in}) dt = \int f_{nom} dt + \int f_{gain} \cdot S_{in} dt = K + f_{gain} \cdot \int S_{in} dt$$

where the term K is a constant that is a function of the constant value $f_{nom}$ and $\Delta T$ (the integration tine) and is therefore well known. For the special case where $f_{nom}=0$ then K=0 and $\Delta\theta = f_{gain} \cdot \int S_{in} dt$ The second term consists of a constant value multiplier $f_{gain}$ and the term $\int S_{in} dt$ which is the integral of the input signal $S_{in}$. The term $f_{gain} \cdot \int S_i dt$ can be easily obtained by subtracting the value of K from the $\Delta\theta$ value at the end of the time period $\Delta T$:

$$f_{gain} \cdot \int S_{in} dt = \Delta\theta - K$$

and $$\int S_{in} dt = (\Delta\theta - K)/f_{gain}$$

For the special case $f_{nom}=0$ and therefore K=0

$$\int S_{in} dt = \Delta\theta / f_{gain}$$

Figure 9A:
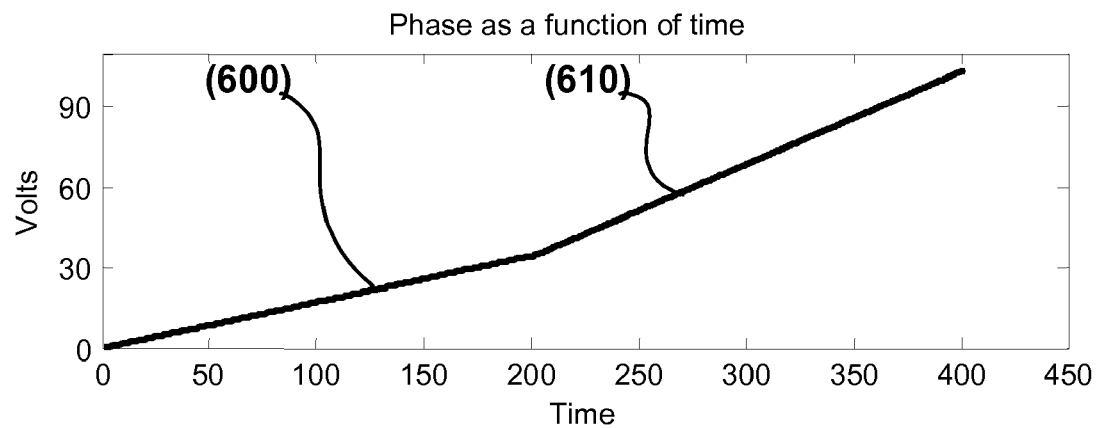
FIGS. 9A and 9B are graphs illustrating an oscillator phase, as determined using the unwrapping method of FIGS.
Figure 9B:
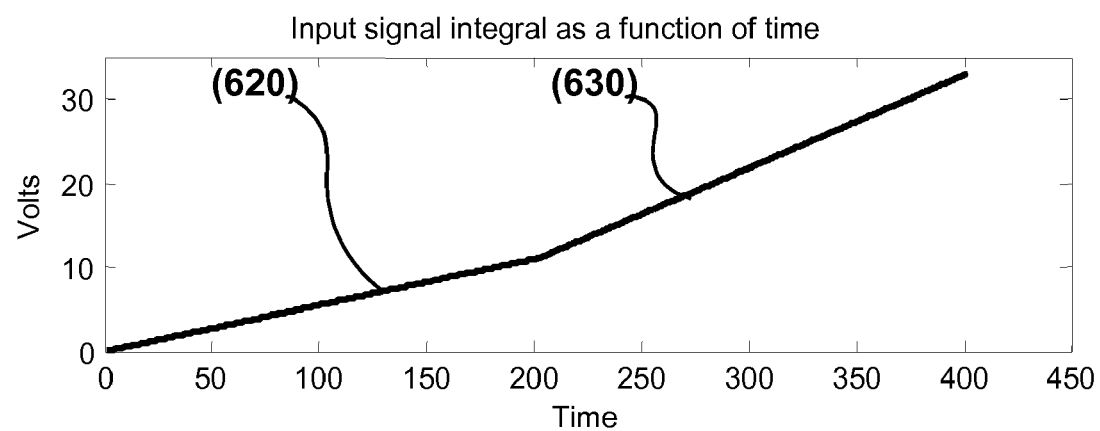

The relationship above establishes the differential relationship between the VCO control input signal $S_{in}$ and the phase $\Delta\theta$ traversed by the VCO or oscillator output during a period of time $\Delta T$. FIGS. 9A and 9B illustrate this equivalence graphically. FIG. 9A plots the phase traversed by the VCO output as a function of time. FIG. 9B plots the integral with respect to time of the input control signal $S_{in}$.

$S_{in}$ is comprised of two constant value segments, the first segments labeled 720 in FIG. 7B being lower in value than the second segments, labeled 730 in FIG. 7B.

Integrator output segment 620 is the integral output as a function of time of $S_{in}$ when the lower value $S_{in}$ segment 720 was input to the integrator. Integrator output segment 630 is the integral output as a function of time of $S_{in}$ when the higher value $S_{in}$ segment 730 was input to the integrator.

The lower value $S_{in}$ segment 720 caused the VCO to oscillate at a lower frequency than the higher value $S_{in}$ segment 730. Waveform segment 700 in FIG. 7a illustrates the lower VCO oscillation frequency. The higher value $S_{in}$ segment at the VCO input causes the VCO to oscillate at a higher frequency than the lower value $S_{in}$ segment. Waveform segment 710 in FIG. 7a illustrates the higher VCO oscillation frequency.

FIG. 9A plots the phase traversed by the VCO as a function of time. Segment 600 corresponds to VCO output segment 700. Segment 610 corresponds to VCO output segment 710. Segment 600 indicates a lower phase accumulation rate than segment 610. The phase accumulation rate is the integral of the phase traversed by the VCO as a function of time and can be expressed in units of radians. The velocity with which the VCO traverses a unit of phase is the frequency of oscillation and can be expressed in units of radians per second.

The VCO control signal input waveform segment 720 causes the VCO to output waveform segment 700. The plot of the VCO output phase as a function of time generates the curve segment 600. The VCO control signal input waveform segment 730 causes the VCO to output waveform segment 710. The plot of the VCO output phase as a function of time generates the curve segment 610.

The waveforms plotted in FIGS. 9A and 9B are identical in shape and are related by the constant $f_{gain}$ and K. in FIG. 9A $f_{nom}=0$ and therefore K=0. The waveforms plotted in FIGS. 9A and 9B are identical in shape and are related by the constants $f_{gain}$ and K when $f_{gain} \neq 0$ and K=0. The time domain integral of the input signal $S_{in}$ is therefore functionally equivalent to the phase domain integral of the input signal $S_{in}$. The time domain integral of the input signal $S_{in}$ and the phase domain integral of the input signal $S_{in}$ are related through two constants, one of which may equal zero.

The use of the method disclosed herein to perform signal integration has advantages over conventional integrators and resolves difficult performance issues associated with conventional integrators. One advantage is the resolution of the potential of the input signal to saturate the integrator output. VCO or oscillator outputs are strictly bound by upper and lower limits (peak values) which are not exceeded under any circumstances. Therefore output voltage saturation conditions cannot occur.

Figure 1:
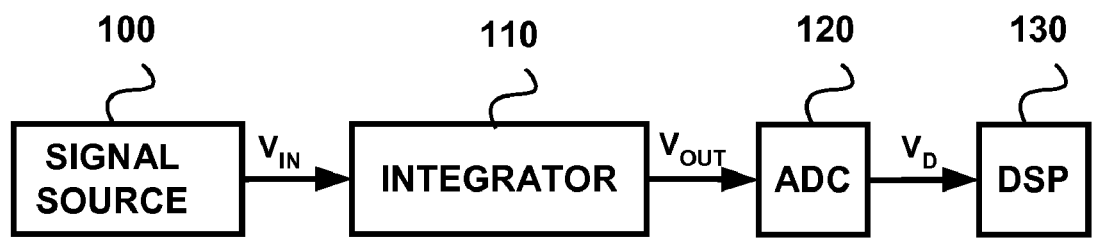
FIG. 1 is a block diagram illustrating several components that are typically included in a sensor device that includes an integrator.
Figure 2:
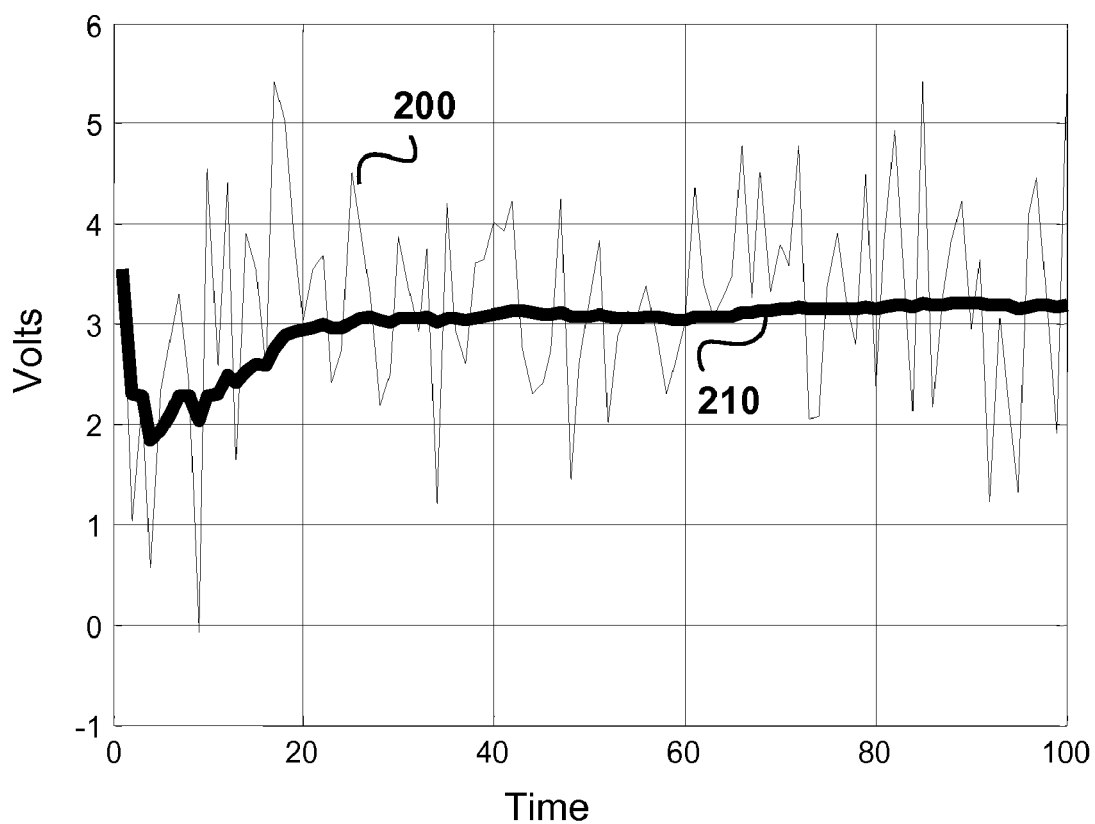
FIG. 2 is a graph of a signal value and a corresponding integrated signal value, provided to illustrate the operation of an integrator
Figure 3:
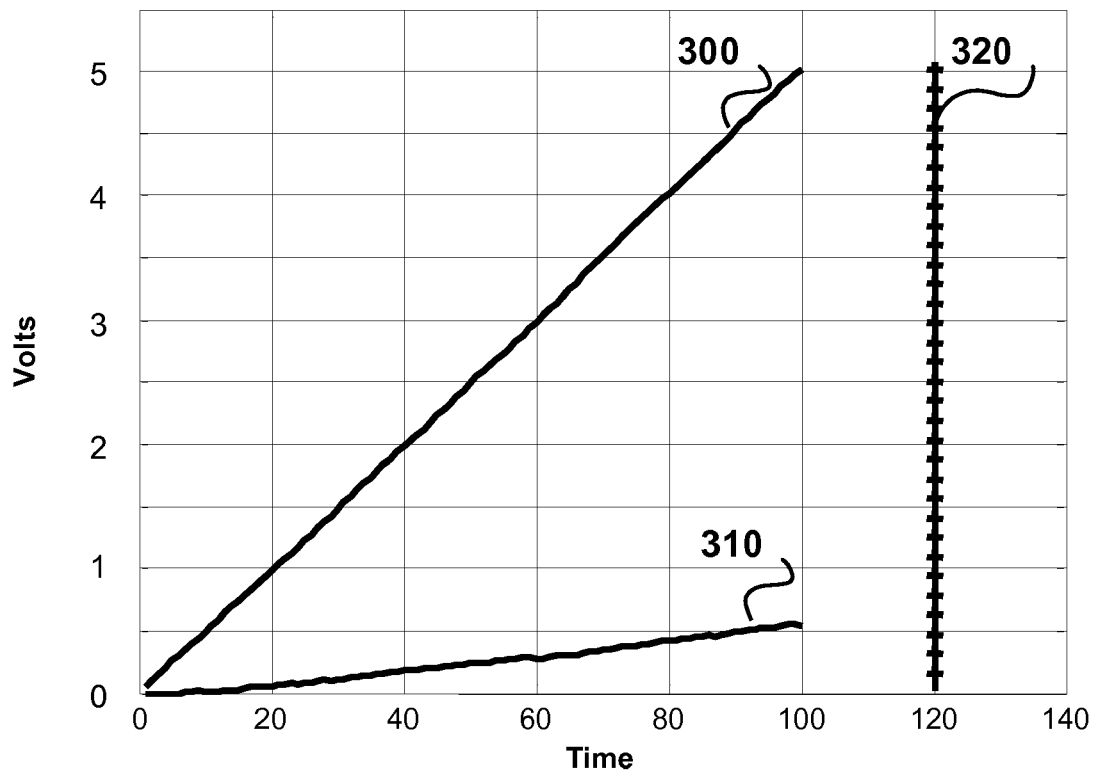
FIG. 3 is a graph illustrating a pair of integrated signals over time, and a quantization scale and is used to describe quantization.
Figure 4A:
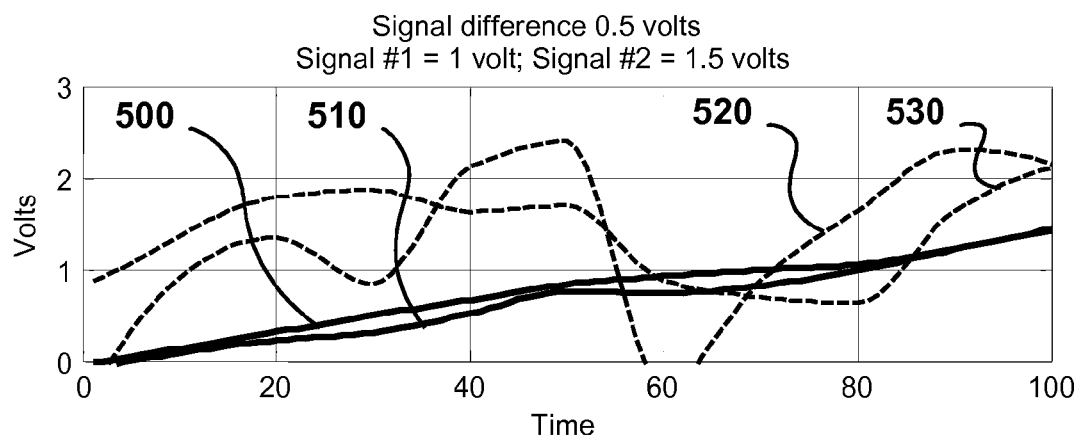
FIGS. 4A and 4B are graphs illustrating signals affected by thermal noise.
Figure 4B:
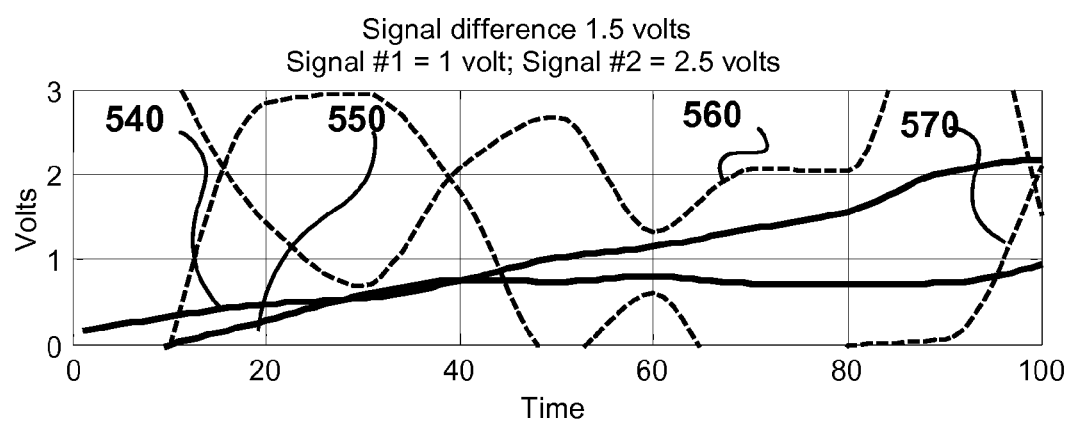
Figure 5:
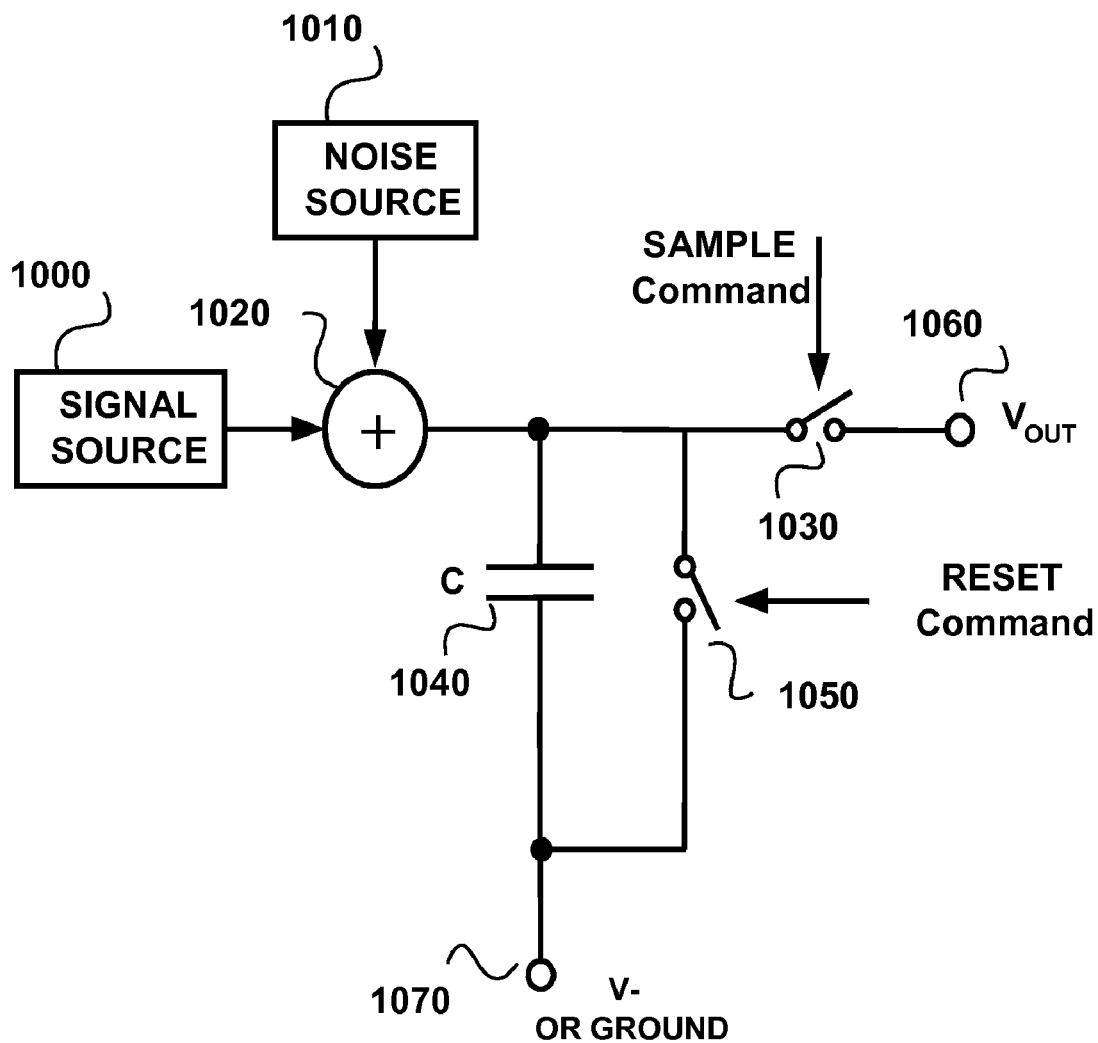
FIG. 5 is a circuit diagram of a typical integrated circuit integrator.

Another advantage is the resolution of the quantization noise issue. As illustrated in FIG. 3 low level signal 310 could suffer from significant and unacceptable quantization noise. Phase measurement based integration measures the phase traversed by the oscillator output $\Delta\theta$ during integration time $\Delta T$. The phase traversed by the oscillator output $\Delta\theta$ during integration time $\Delta T$ is proportional to the integral of the input control signal during integration time $\Delta T$ and the two are proportional. The minimum $\Delta\theta$ value occurs for the smallest integral output. But $f_{gain} \cdot \int S_{in} dt = \Delta\theta - K$ where K is a constant. Therefore $\Delta\theta - K$ can be independently set to a specific value for any given value of $\int S_{in} dt$, including its minimum, by simply adjusting the VCO gain $f_{gain}$. The ability to set the gain of the integrator and hence the minimum value of the measured integrator output variable eliminates the quantization noise issue associated with conventional integrators.

Yet another advantage is that variable oscillator circuits are common and fundamental building blocks of a wide variety of systems. Therefore they are widely available and have been highly optimized.

Accordingly, oscillator based integrators are far superior to conventional integrators in quantization noise and dynamic range or lack of output saturation. Other advantages exist and are apparent to one versed in the art.

Having described various exemplary embodiments of the present invention, it will be understood by those of ordinary skill in the art that modification to and variation of the illustrated embodiments may be made without departing from the inventive concepts herein disclosed. Moreover, while the preferred embodiments are described in connection with various illustrative structures, one skilled in the art will recognize that the system may be embodied using a variety of specific structures. Accordingly, the invention should not be viewed as limited except by the scope and spirit of the appended claims.

The invention claimed is:

1. A method for integrating an input signal over a time period includes the step of:

generating an integrated value of the input signal using phase information generated by accumulating a sum of traversed periods of an output waveform provided by a voltage controlled oscillator coupled to the input signal.

2. The integration method of claim 1 wherein the output waveform varies in frequency in response to a value of the input signal.

3. The method according to claim 1, wherein the step of generating further includes the step of identifying a phase of the output waveform at the end of the time period and wherein the integrated value is determined by the phase and the sum of traversed periods.

4. The method according to claim 2 further including the step of adjusting a frequency of the oscillator in accordance with an intensity of the input signal.

5. An integrator including:

an input for receiving an input signal;

an output for providing an integrated signal;

an oscillator coupled to the input and operable to provide an output waveform response in accordance with a value of the input signal; and logic for processing the output waveform response provided by the oscillator including accumulating a sum of traversed periods of the output waveform during an integration period to provide the integrator result.

6. The integrator of claim 5 including logic for determining a traversed phase of the output waveform by identifying a difference in phase of the output waveform between a start and an end of the integration period.

7. The integrator of claim 6 wherein the logic for determining the traversed phase includes a voltage to phase converter.

8. The integrator according to claim 5, wherein the logic for processing further includes logic for determining a phase of the output waveform at the end of the integration period, and wherein the integrated value is determined according to the phase and the sum of traversed periods.

9. The integrator of claim 5 wherein the oscillator includes an input for adjusting a frequency of the oscillator in accordance with an intensity of the input signal.

10. The integrator of claim 5 wherein the oscillator is a voltage controlled oscillator.

11. The integrator of claim 5 wherein the oscillator is a current controlled oscillator.

12. An integration method including the steps of:

converting an input signal into a waveform having a frequency related to a value of the input signal; and accumulating a sum of phases traversed by the waveform to generate an integrated value of the signal.

13. An integrator comprising:

means for converting an input signal into a waveform having a frequency related to a value of the input signal; and means for accumulating a sum of phases traversed by the waveform to generate an integrated value of the signal.

* * * * *

UNITED STATES PATENT AND TRADEMARK OFFICE
CERTIFICATE OF CORRECTION

PATENT NO. : 7,532,145 B2
APPLICATION NO. : 11/533859
DATED : May 12, 2009
INVENTOR(S) : Davidovici Page 1 of 1

It is certified that error appears in the above-identified patent and that said Letters Patent is hereby corrected as shown below:

On the title page item (73), please replace the Assignee "RJS Technologies, Inc" with --RJS Technology, Inc.--

Signed and Sealed this

Twenty-third Day of February, 2010

David J. Kappos
*Director of the United States Patent and Trademark Office*